(12) United States Patent
Gutsche et al.

(10) Patent No.: US 7,303,970 B2
(45) Date of Patent: Dec. 4, 2007

(54) METHOD OF FABRICATING DIELECTRIC MIXED LAYERS AND CAPACITIVE ELEMENT AND USE THEREOF

(75) Inventors: Martin Gutsche, Dorfen (DE); Harald Seidl, Pöring (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/125,654

(22) Filed: May 10, 2005

(65) Prior Publication Data

US 2005/0258510 A1 Nov. 24, 2005

(30) Foreign Application Priority Data

May 18, 2004 (DE) .................... 10 2004 024 665

(51) Int. Cl.
*H01L 21/20* (2006.01)
(52) U.S. Cl. ............................. 438/381; 257/E21.396
(58) Field of Classification Search ............... 438/381, 438/386–388, 393, 396, 3, 171, 190, 210, 438/238, 239, 250, 253, 387; 257/E27.048, 257/E27.09, E21.396, E21.664, 21.351
See application file for complete search history.

(56) References Cited

U.S. PATENT DOCUMENTS

| | | | |
|---|---|---|---|
| 6,013,553 A | 1/2000 | Wallace et al. | |
| 6,407,435 B1 * | 6/2002 | Ma et al. | 257/411 |
| 6,548,368 B1 | 4/2003 | Narwankar et al. | |
| 6,624,093 B1 | 9/2003 | Lyman et al. | |
| 6,667,207 B2 * | 12/2003 | Ballantine et al. | 438/234 |
| 6,680,228 B2 * | 1/2004 | Ahn et al. | 438/253 |
| 2003/0211718 A1 | 11/2003 | Koyama et al. | |
| 2004/0087100 A1 | 5/2004 | Gousev et al. | |
| 2006/0120020 A1 * | 6/2006 | Dowgiallo, Jr. | 361/313 |

OTHER PUBLICATIONS

Segda et al., "Study and Optimization of Alumina and Germanium Dioxide and Their Multilayer Capacitor Properties," *Nuclear Instruments and Methods in Physics Research B*, vol. 170, pp. 105-114 (2000).

* cited by examiner

*Primary Examiner*—Brook Kebede
(74) *Attorney, Agent, or Firm*—Jenkins, Wilson, Taylor & Hunt, P.A.

(57) ABSTRACT

The present invention provides a method for fabricating a capacitive element (100), a substrate (101) being provided as a first electrode layer of the capacitive element (100), the substrate (101) provided as an electrode layer is conditioned, a dielectric layer (102) is deposited on the conditioned substrate (101) and a second electrode layer (104) is applied on the layer stack produced, the layer stack being modified by a heat treatment in such a way that the dielectric layer (102) deposited on the conditioned substrate (101) forms a dielectric mixed layer (105) with a reaction layer (103) deposited on the dielectric layer (102), which dielectric mixed layer has an increased dielectric constant (k) or an increased thermal stability.

2 Claims, 2 Drawing Sheets

METHOD OF FABRICATING DIELECTRIC MIXED LAYERS AND CAPACITIVE ELEMENT AND USE THEREOF

TECHNICAL FIELD

The present invention generally relates to the field of miniaturized capacitive elements contained in electronic circuit units (electronic chips). Capacitive elements of this type require dielectrics (dielectric layers) having a highest possible relative permittivity or dielectric constant k.

BACKGROUND ART

In particular, the present invention relates to a method for fabricating a capacitive element in which a substrate is provided, which substrate serves as a first electrode layer of the capacitive element, in which the substrate provided as a first electrode layer is conditioned, in which a dielectric layer is deposited on the conditioned substrate, and in which a second electrode layer is subsequently applied.

Conventional dielectric layers for capacitive elements disadvantageously have a low dielectric constant k. Reoxidized nitrides (NO) are usually used in the fabrication of capacitive elements. In order to increase the dielectric constant k of the capacitive element and thus in order to increase the capacitance of the capacitive element, it has already been proposed to use other dielectrics such as, for example, aluminum oxide ($Al_2O_3$), hafnium oxide ($HfO_2$), etc. It has furthermore been attempted to improve the electrical properties of the reoxidized silicon nitride (NO) that is usually used by means of adapting nitride thicknesses used and by means of optimizing the process parameters during a subsequent reoxidation.

In an inexpedient manner, limits are placed on the conventional methods in the case of increasing the dielectric constant and also in the case of the thermal stability of the dielectric layer.

SUMMARY OF THE INVENTION

Therefore, it is an object of the present invention to provide a capacitive element with an increased capacitance in conjunction with an improved thermal stability.

This object is achieved by means of a method specified in Patent Claim 1.

Furthermore, the above object is achieved by means of a layer stack for a capacitive element having the features of Patent Claim 15 and also a capacitive element having the features of Patent Claim 26.

Further refinements of the invention emerge from the subclaims.

An essential concept of the invention consists in admixing with a dielectric layer used in a capacitive element, by means of suitable solid phase reactions, further substances that lead to an increase in the effective dielectric constant. According to the invention, a reactive layer or reaction layer is applied to a deposited dielectric layer and is subsequently brought to reaction with the underlying or the overlying dielectric layer or with both both dielectric layers by means of a heat treatment and/or reoxidation step. After the reaction layer has been deposited on the dielectric layer, a layer stack formed in this way is subjected to heat treatment, so that the dielectric layer deposited on a conditioned substrate forms a dielectric mixed layer with the reaction layer deposited on the dielectric layer.

Consequently, the method according to the invention has the advantage that it is possible to produce an improved dielectric, i.e. a dielectric layer with an increased dielectric constant k in conjunction with an improved thermal stability.

The method according to the invention for fabricating a capacitive element essentially has the following steps of:
a) providing a substrate, which serves as a first electrode or as a first electrode layer of the capacitive element;
b) conditioning the substrate provided as an electrode layer;
c) depositing a dielectric layer on the conditioned substrate; and
d) depositing a second electrode layer, in which case, prior to the above step d) of depositing the second electrode layer, a reaction layer is applied on the dielectric layer deposited on the substrate and the layer stack that has been formed up to that point, i.e. by means of the above steps a), b) and c) and also by means of the application of the reaction layer, is subjected to heat treatment in such a way that the dielectric layer deposited on the conditioned substrate is converted into a dielectric mixed layer with the reaction layer deposited on the dielectric layer.

Furthermore, it is possible for the layer stack formed by means of the above steps a), b) and c) and also by means of the application of the reaction layer to be subjected to heat treatment after step d) of depositing the second electrode layer or before and after said step.

Consequently, a layer stack according to the invention for a capacitive element that is fabricated by the above method essentially has:
a) a substrate, which serves as a first electrode or as a first electrode layer of the capacitive element;
b) a dielectric layer deposited on the substrate; and
c) an electrode layer applied on the dielectric layer, in which case, the layer stack further has a reaction layer embedded between the dielectric layer and the second electrode layer, the layer stack formed from the first electrode layer, the dielectric layer and the reaction layer being subjected to heat treatment prior to an application of the second electrode layer in such a way that the dielectric layer deposited on the substrate forms a dielectric mixed layer with the reaction layer deposited on the dielectric layer.

Advantageous developments and improvements of the respective subject-matter of the invention are found in the subclaims.

In accordance with one preferred development of the present invention, the steps of depositing the dielectric layer on the conditioned substrate, depositing a reaction layer on the dielectric layer and heat treating in such a way that a dielectric mixed layer is formed are performed multiply, preferably n times, in order to obtain a dielectric layer stack.

In accordance with yet another preferred development of the present invention, the steps of depositing a dielectric layer on the conditioned substrate and depositing a reaction layer on the dielectric layer are performed multiply, preferably m times, the step of heat treating the layer stack thus obtained subsequently being performed in order to obtain a dielectric layer stack.

Furthermore, it is possible for a reaction layer to be embedded between an upper and a lower dielectric layer, a subsequent reaction being effected by means of the heat treatment.

In accordance with yet another preferred development of the present invention, the steps of depositing a dielectric layer on the conditioned substrate and depositing a reaction layer on the dielectric layer are performed multiply, the step of heat treatment in order to obtain dielectric mixed layers subsequently being performed once.

In accordance with yet another preferred development of the present invention, the steps of depositing a dielectric layer on the conditioned substrate and depositing a reaction layer on the dielectric layer are performed multiply, the step of depositing a further dielectric layer and the step of heat treatment in order to obtain a dielectric mixed layer stack subsequently being performed once in each case.

In accordance with yet another preferred development of the present invention, the heat treatment in the step for forming dielectric mixed layers comprises a reoxidation.

Furthermore, it is possible for the layer stack provided by means of the process steps described above to be subjected to heat treatment after depositing the second electrode layer.

The heat treatment may be carried out inter alia in an inert or in an oxygen-containing atmosphere. Use is preferably made of a process sequence in which provision is made of a reoxidation in an oxygen-containing environment, such as, for example, ozone, atomic or molecular oxygen, or oxygen plasma, or a moisture oxidation.

In accordance with yet another preferred development of the present invention, a conditioning of the substrate provided as an electrode layer is effected by means of a wet-chemical etching or treatment. Furthermore, it is advantageous to carry out the conditioning of the substrate provided as an electrode layer by means of a heat treatment, such as, for example, RTP (Rapid Thermal Processing), RTO (Rapid Thermal Oxidation) and/or RTN (Rapid Thermal Nitridation).

In accordance with yet another preferred development of the present invention, after depositing the dielectric layer on the conditioned substrate and heat-treating the layer stack in such a way that the dielectric layer deposited on the conditioned substrate is converted into a dielectric mixed layer with the reaction layer deposited on the dielectric layer, a further dielectric layer is deposited and brought to reaction.

The substrate that is provided as a first electrode layer of the capacitive element is preferably embodied from silicon.

Furthermore, it is advantageous if the at least one dielectric layer is formed from at least one material compound from the group $Si_xN_y$, such as $Si_3N_4$, Si—O, silicon oxynitride Si—O—N, aluminum nitride Al—N, aluminum oxide Al—O, aluminum oxynitride Al—O—N, hafnium oxide Hf—O, hafnium oxynitride Hf—O—N, zirconium oxide Zr—O, zirconium oxynitride Zr—O—N, titanium oxide Ti—O, titanium oxynitride Ti—O—N, tantalum oxide Ta—O, tantalum oxynitride Ta—O—N, lanthanide oxides such as Ln—O, Ln—O—N, where Ln=La, Nd, Pr or other rare earths, and yttrium oxides such as Y—O, Y—O—N, or silicates and aluminates of these compounds such as Hf—Si—O, Hf—Al—O.

The reaction layer, with which the dielectric layer forms a dielectric mixed layer in the course of the heat treatment process, is preferably provided as a metal layer, a metal nitride layer, a metal silicon nitride layer, or as an oxidic layer with an oxygen deficit.

Furthermore, the reaction layer may be formed as a metal nitride layer, a metal silicon nitride layer, a metal silicide layer, an oxidic layer with an oxygen deficit, or a silicon nitride layer.

In accordance with yet another preferred development of the present invention, the dielectric mixed layer has a dielectric constant (k) that is altered with respect to the dielectric layer. The dielectric constant (k) of the dielectric mixed layer is preferably increased with respect to that of the dielectric layer, or the mixed layer has an increased thermal stability.

In accordance with yet another preferred development of the present invention, the materials of the at least one dielectric layer and of the at least one reaction layer are provided from at least one combination of $SiO_2$ and metal, $SiO_2$ and metal nitride, SiN and metal, SiN and metal nitride, SiON and metal, SiON and metal nitride, reoxidized SiN and metal, reoxidized SiN and metal nitride, $Al_2O_3$ and $Hf_xN_y$, $HfO_2$ and $Al_xN_y$, $ZrO_2$ and $Al_xN_y$, $Al_2O_3$ and $Si_xN_y$, $Al_2O_3$ and $Ln_xN_y$, or $Ln_xO_y$ and $Al_xN_y$.

Furthermore, it is advantageous to form the dielectric mixed layer multiply (n times) on one another in order to obtain a dielectric layer stack.

Exemplary embodiments of the invention are illustrated in the drawings and are explained in more detail in the description below.

DETAILED DESCRIPTION OF THE INVENTION

In the figures, identical reference symbols designate identical or functionally identical components or steps.

Figure 1:
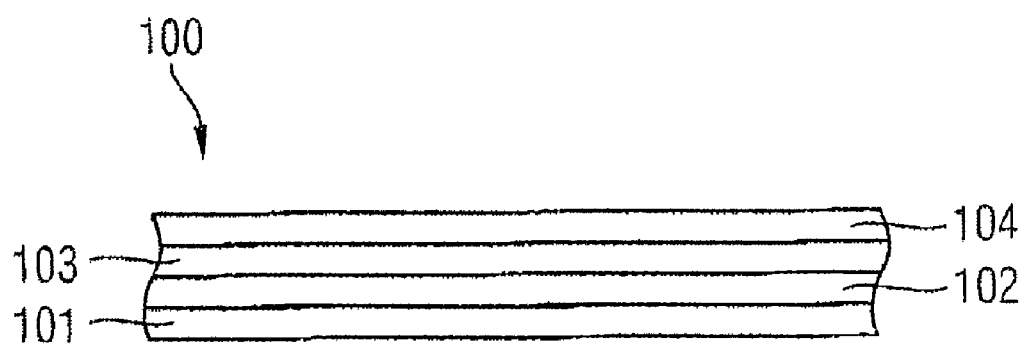
FIG. 1 shows a capacitive element with a dielectric layer and a reaction layer in accordance with one preferred embodiment of the present invention.

The capacitive element 100 shown in FIG. 1 has a substrate 101 provided as a first electrode layer of the capacitive element 100, a dielectric layer 102 being applied on said substrate. Before the dielectric layer 102 is applied to the substrate 101, the latter is conditioned for example by means of a heat treatment in various ambient gas atmospheres or by means of conventional wet-chemical methods. Conditioning means, in particular, that, if the substrate 101 comprises silicon, silicon oxide ($SiO_2$) or SiN or SiON is excited on the surface in order to facilitate the further layer construction process.

Figure 2:
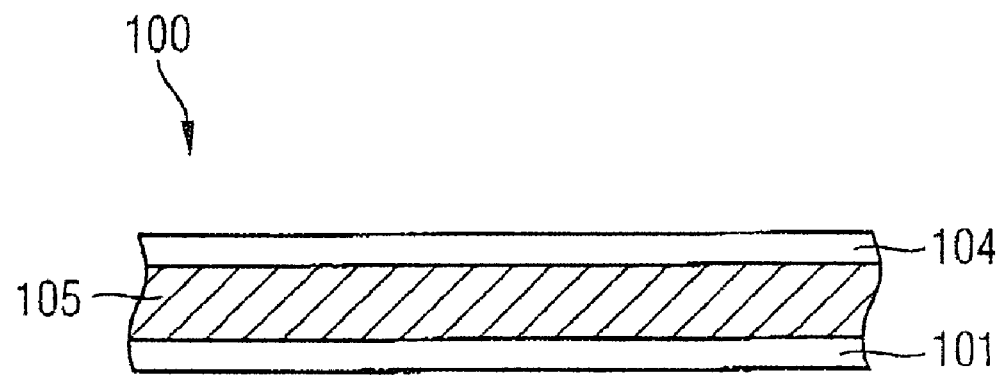
FIG. 2 shows the capacitive element shown in FIG. 1 after the formation of a dielectric mixed layer.

FIG. 1 schematically shows the layer sequence for the capacitive element 100, while FIG. 2 illustrates an arrangement according to the invention for the capacitive element 100, in such a way that a mixed layer 105 is formed by a heat treatment step. In order to obtain the capacitive element 100 shown in FIG. 2, after the steps of providing the substrate 101 and conditioning the substrate 101 provided as a first electrode layer, a dielectric layer 102 is deposited on the conditioned substrate 101, whereupon a reaction layer 103 is deposited on the dielectric layer 102 (cf. FIG. 1).

Afterward, the layer stack formed by the substrate 101, the dielectric layer 102 and the reaction layer 103 deposited on the dielectric layer is subjected to heat treatment, in such a way that the dielectric layer 102 deposited on the conditioned substrate 101 is converted into the dielectric mixed layer 105 with the reaction layer 103 deposited on the dielectric layer 102 (dashed layer region in FIG. 2). In this case, the process parameters are preferably set in such a way that the value of a dielectric constant k of the dielectric mixed layer 105 exceeds that of the dielectric layer 102, and/or that the thermal stability of the mixed layer is increased, as will be explained below.

Figure 3:
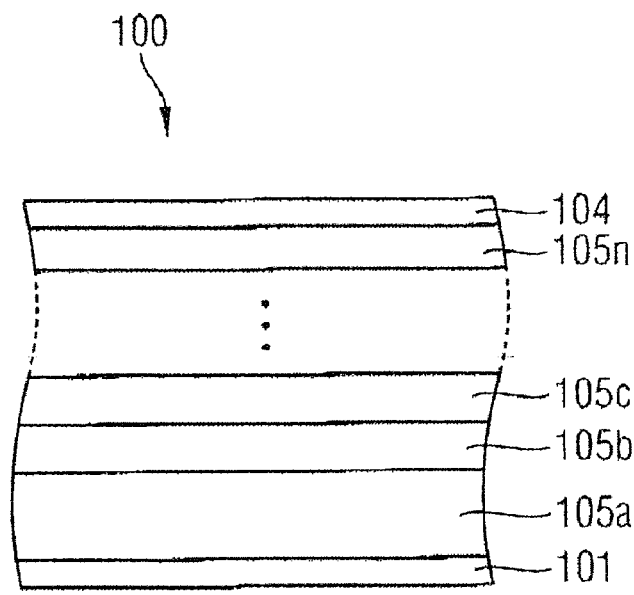
FIG. 3 shows a capacitive element embodied from multiple dielectric mixed layers that form a dielectric layer stack.

The fundamental layer sequence shown in FIGS. 1 and 2, for attaining the dielectric mixed layers, can be varied in diverse ways. In this respect, FIG. 3 shows an example in which the method steps for attaining the layer stack of FIG. 2 are repeated multiply (n times). In this case, after depositing a dielectric layer 102 on the conditioned substrate 101, firstly a first reaction layer 103 is then deposited on the (first) dielectric layer 102. A heat treatment step is subsequently carried out in order to obtain a first dielectric mixed layer 105a. Afterward, a second dielectric layer 102 is deposited on the first dielectric mixed layer 105a, and a second reaction layer 103 is deposited on the second dielectric layer, whereupon a heat treatment step is once again carried out, in such a way that a second dielectric mixed layer 105b is formed, etc. through to the n-th mixed layer 105n.

FIG. 3 shows a layer stack after n-fold repetition of the steps described above. After the n-fold repetition of the steps described above, a second electrode layer 104 is finally applied on the topmost dielectric mixed layer 105n in order to provide a connection of the capacitive element 100 via the substrate 101 formed as a first electrode layer and the second electrode layer 104.

Figure 4:
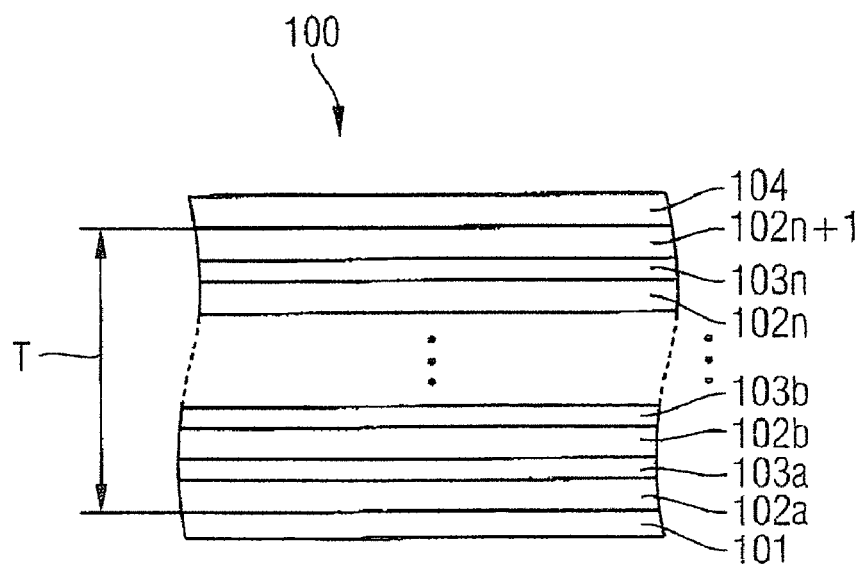
FIG. 4 shows a further exemplary embodiment of a capacitive element with multiple dielectric layers and multiple reaction layers in accordance with a further preferred exemplary embodiment of the present invention.

Before the layer composition is discussed in detail, a further fundamental exemplary embodiment of the method of the present invention will be explained with reference to FIG. 4. FIG. 4 shows that a sequence of dielectric layers 102a-102n and reaction layers 103a-103n, respectively applied alternately, is provided on the substrate provided as a first electrode layer. After the alternate deposition processes have been carried out n times, a further dielectric layer 102n+1 is applied on the topmost reaction layer 103n shown in FIG. 4. Afterward, the region identified by the reference symbol T in FIG. 4, i.e. the layer stack through to the topmost dielectric layer 102n+1, is subjected to heat treatment, in such a way that the dielectric layers 102a-102n and reaction layers 103a-103n deposited alternately on the conditioned substrate 101 form a uniform mixed layer 105 (not shown).

The materials used in the substrate 101, the dielectric layer 102, the reaction layer 103 and the second electrode layer 104 are discussed in greater detail below.

The reaction layer 103 is formed by a reactive layer (not oxygen-saturated) that is ready for reaction, in particular by a metal-containing layer or a metal layer, a metal nitride layer, a metal silicon nitride layer, etc. The substrate 101 provided as a first electrode layer of the capacitive element 100 is preferably formed from silicon, although substrate 101 can be formed from metal and as a metal electrode. Prior to depositing the dielectric layer 102 on the substrate 101, the latter must be "conditioned". Conditioning may be effected by means of conventional wet-chemical processes or by means of heat treatment steps such as, for example, rapid thermal processing (RTP), rapid thermal oxidation (RTO) and/or rapid thermal nitridation (RTN). The dielectric layer 102, which is deposited subsequently, i.e. after the substrate 101 provided as a first electrode layer has been conditioned, may comprise an amorphous, polycrystalline or monocrystalline material. Preference is given to materials comprising the combination Si—N such as, for example, $Si_3N_4$, (silicon nitride) or a material having deviating stoichiometry. Further preferred materials are silicon oxide Si—O, silicon oxynitride Si—O—N, aluminum nitride Al—N, aluminum oxide Al—O, aluminum oxynitride Al—O—N, hafnium oxide Hf—O, hafnium oxynitride Hf—O—N, zirconium oxide Zr—O, zirconium oxynitride Zr—O—N, titanium oxide Ti—O, titanium oxynitride Ti—O—N, tantalum oxide Ta—O, tantalum oxynitride Ta—O—N, lanthanide oxides such as, for example, Ln—O, Ln—O—N (where Ln=La, Nd, Pr, etc.) and yttrium oxides such as, for example, Y—O, Y—O—N, and also silicates and aluminates of the above compounds such as, for example, Hf—Si—O, Hf—Al—O, etc. Furthermore, it is possible for the reoxidized nitride NO that is conventionally used to be used as the dielectric layer 102 deposited on the first electrode layer.

The reactive layer, i.e. layer that is ready for reaction and is not oxygen-saturated, preferably comprises metallic materials such as, for example, Hf, Zr, Ti, Ta, Nb, Al, La, Y, lanthanides (Ce, Pr, ...) or metal nitrides, in particular those which have a nitrogen depletion such as, for example HfN, ZrN, TiN, or metal silicon nitrides such as HfSiN, TaSiN, TiSiN, etc. Furthermore, metal silicides, such as, for example, HfSi, ZrSi, TiSi, are used as the reaction layer 103.

It is furthermore possible to use dielectrics/oxides that are possibly not completely oxygen-saturated such as, for instance Hf—O, Hf—O—N, Zr—O, Zr—O—N, Ti—O, Ti—O—N, Ta—O, Ta—O—N, La—O, La—O—N, Y—O, Y—O—N, lanthanide oxides, silicates and aluminates of the above materials and Si—O, Si—O—N, Al—N, Al—O, Al—O—N, oxygen being contained substoichiometrically in each case. A heat treatment of the layer stack formed from at least one dielectric layer 102 and at least one reaction layer 103 is referred to as an aftertreatment, which results in the desired reaction of the dielectric layer 102 with the respectively overlying reactive layer (reaction layer) 103 and the formation of a respective dielectric mixed layer 105a-105n having preferably an increased dielectric constant k or an increased thermal stability.

Furthermore, an aftertreatment may also be provided after an electrode deposition or after a step of depositing a second electrode layer.

An aftertreatment or heat treatment may preferably be provided in an inert atmosphere, by means of an oxidation in an oxygen-containing atmosphere ($O_2$, atomic oxygen O, $O_3$, plasma oxygen), preferably at elevated temperature, a moisture oxidation, a heat treatment in an inert gas with subsequent oxidation (inter alia also moisture oxidation) and/or a combination with a temporally limited heat treatment step in a reducing atmosphere such as $H_2$ for example.

Examples for fabricating a capacitive element 100 will be explained below with reference to suitable materials.

In a first exemplary capacitive element 100, firstly a suitable trench structure is provided, then a dielectric layer is produced by means of a low-pressure chemical vapor deposition, the dielectric layer being formed from SiN or SiON. The reactive metallic layer, i.e. the reaction layer 103, which is preferably provided from Hf, Zr, La, Y, lanthanides, Al or the (possibly substoichiometric) nitrides or oxides (HfN, ZrN, AlN, etc.) thereof, is deposited onto the dielectric layer. Finally, a heat treatment is effected in an inert or slightly oxygen-containing environment in such a way that a reoxidation such as, for example, a moisture oxidation occurs. Furthermore, it is possible to provide a heat treatment with a subsequent reoxidation.

In order to fabricate a second exemplary capacitive element 100, as above firstly a suitable trench structure is provided, an SiN layer is deposited, whereupon a reoxidation of the SiN and a formation of an NO layer stack are effected in order to obtain an improved dielectric (having an increased dielectric constant k) with respect to the first capacitive element. The remaining process steps correspond to those described above with reference to the first capacitive element.

Finally, it is possible to fabricate a third capacitive element, firstly a substrate being provided, an SiN layer being produced by means of a low-pressure chemical vapor deposition, a reactive metallic monolayer being produced by means of atomic layer deposition (ALD), for example, materials such as Hf, Zr, La, Y, lanthanides, Al preferably being used. A heat treatment as in the examples of the first and second capacitive elements 100 shown above is subsequently effected.

In a fourth example of a capacitive element, firstly an Si substrate is provided, then the Si substrate is passivated for example by means of rapid thermal oxidation (RTO) or rapid thermal nitridation (RTN), whereupon a reactive metal layer is deposited. The reactive metal layer is preferably deposited as a metallic monolayer which is formed as described above with reference to the third capacitive element. The remaining steps of depositing an SiN layer or growing an SiON layer and heat treatment in an inert or slightly oxygen-containing environment are effected as described above with reference to the third capacitive element.

It should be pointed out that the step of depositing a second electrode layer 104 on the layer stack provided in the various capacitive elements 1 to 4 must in each case be effected after the process steps described above, in order to obtain a functional capacitive element 100.

Although the present invention has been described above on the basis of preferred exemplary embodiments, it is not restricted thereto, but rather can be modified in diverse ways.

Moreover, the invention is not restricted to the application possibilities mentioned.

LIST OF REFERENCE SYMBOLS

In the figures, identical reference symbols designate identical or functionally identical components or steps.
100 Capacitive element
101 Substrate, first electrode layer
102, Dielectric layer
102a-
102n+1
103, Reaction layer
103a-
103n
104 Second electrode layer
105 Dielectric mixed layer
105a- Dielectric layer stack
105n

What is claimed is:

1. Method for fabricating a capacitive element, comprising the steps of:
 a) providing a substrate which serves as a first electrode layer of the capacitive element;
 b) conditioning the substrate provided as a first electrode layer;
 c) depositing a dielectric layer on the conditioned substrate;
 c1) depositing a reaction layer on the dielectric layer;
 c2) heat-treating a layer stack formed in steps a), b), c) and c1) in such a way that the dielectric layer deposited on the conditioned substrate reacts with the reaction layer by means of a solid phase reaction so that the dielectric layer and the reaction layer convert into a dielectric mixed layer wherein the heat treatment comprises a reoxidation in an oxygen-containing environment selected from ozone, atomic or molecular oxygen, or oxygen plasma, or a moisture oxidation;
 c3) depositing a further dielectric layer on the dielectric mixed layer;
 c4) depositing a further reaction layer on the further dielectric layer;
 c5) heat-treating a layer stack formed in steps a), b), c1), c2), c3) and c4) in such a way that the further dielectric layer reacts with the further reaction layer by means of a solid phase reaction so that the further dielectric layer and the further reaction layer convert into a further dielectric mixed layer; and
 d) depositing a second electrode layer.

2. Method for fabricating a capacitive element, comprising the steps of:
 a) providing a substrate which serves as a first electrode layer of the capacitive element;
 b) conditioning the substrate provided as a first electrode layer;
 c) depositing a dielectric layer on the conditioned substrate
 c1) depositing a reaction layer on the dielectric layer;
 c2) heat-treating a layer stack formed in steps a), b), c) and c1) in such a way that the dielectric layer deposited on the conditioned substrate reacts with the reaction layer by means of a solid phase reaction so that the dielectric layer and the reaction layer convert into a dielectric mixed layer wherein the heat treatment is carried out in an inert atmosphere;
 c3) depositing a further dielectric layer on the dielectric mixed layer;
 c4) depositing a further reaction layer on the further dielectric layer;
 c5) heat-treating a layer stack formed in steps a), b), c1), c2), c3) and c4) in such a way that the further dielectric layer reacts with the further reaction layer by means of a solid phase reaction so that the further dielectric layer and the further reaction layer convert into a further dielectric mixed layer; and
 d) depositing a second electrode layer.

* * * * *